(12) United States Patent
Chen et al.

(10) Patent No.: US 11,280,946 B2
(45) Date of Patent: Mar. 22, 2022

(54) POLARIZING SHEET, DISPLAY SCREEN, TERMINAL, AND METHOD FOR MANUFACTURING POLARIZING SHEET

(71) Applicant: BEIJING XIAOMI MOBILE SOFTWARE CO., LTD., Beijing (CN)

(72) Inventors: Wei Chen, Beijing (CN); Zhiwen Xu, Beijing (CN); Jiwei Chen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/555,048

(22) Filed: Aug. 29, 2019

(65) Prior Publication Data

US 2020/0225396 A1 Jul. 16, 2020

(30) Foreign Application Priority Data

Jan. 11, 2019 (CN) .......................... 201910027588.2

(51) Int. Cl.
*G02B 5/30* (2006.01)
*G02F 1/1335* (2006.01)
*H01L 27/32* (2006.01)
*H01L 51/52* (2006.01)

(52) U.S. Cl.
CPC ..... *G02B 5/3033* (2013.01); *G02F 1/133528* (2013.01); *H01L 27/32* (2013.01); *H01L 51/5293* (2013.01)

(58) Field of Classification Search
CPC .. G02B 5/3025; G02B 5/3033; G02B 5/3041; G02B 5/305; G02F 1/133528; G02F 1/133538; H01L 27/32; H01L 27/3239; H01L 51/5293
See application file for complete search history.

(56) References Cited

U.S. PATENT DOCUMENTS

| 2010/0259708 A1* | 10/2010 | Hiratsuka | .............. G02B 5/305 |
| | | | 349/74 |
| 2014/0118826 A1* | 5/2014 | Jiao | ......................... G06F 3/041 |
| | | | 359/491.01 |
| 2015/0131035 A1 | 5/2015 | Chen | |
| 2016/0202403 A1 | 7/2016 | Mathew et al. | |
| 2016/0238766 A1 | 8/2016 | Huang et al. | |
| 2018/0356680 A1* | 12/2018 | Huang | ................. G02B 5/3033 |

OTHER PUBLICATIONS

Extended European Search Report in EP 19194294.5 dated Dec. 10, 2019.

* cited by examiner

*Primary Examiner* — Edward J Glick
*Assistant Examiner* — David Y Chung
(74) *Attorney, Agent, or Firm* — Syncoda LLC; Feng Ma

(57) ABSTRACT

A polarizing sheet includes a base layer, and a polarizing layer attached to the base layer. The polarizing layer includes, in a same plane, a combination of any two or more of a first region, a second region, or a third region. The first region, the second region and the third region have different light transmission properties.

18 Claims, 12 Drawing Sheets

POLARIZING SHEET, DISPLAY SCREEN, TERMINAL, AND METHOD FOR MANUFACTURING POLARIZING SHEET

CROSS-REFERENCE TO RELATED APPLICATIONS

This application claims priority to Chinese Patent Application Serial No. 201910027588.2 filed on Jan. 11, 2019, the disclosure of which is incorporated herein by reference in its entirety.

BACKGROUND

A polarizing sheet can be an important part of a display screen. Many different devices, such as mobile phones, tablet computers, televisions, etc., adopt display screens with polarizing sheets.

SUMMARY

The present disclosure relates to the field of display screens, and more particularly to a polarizing sheet and a manufacture method thereof, and a display screen and a terminal having the same.

According to a first aspect of embodiments of the present disclosure, there is provided a polarizing sheet, including a base layer; and a polarizing layer attached to the base layer. The polarizing layer includes, in a same plane, a combination of any two or more of a first region, a second region and a third region. The first region, the second region and the third region have different light transmission properties.

According to a second aspect of embodiments of the present disclosure, there is provided a display screen. The display screen includes a polarizing sheet as described in any embodiment of the first aspect of the present disclosure.

According to a third aspect of embodiments of the present disclosure, there is provided a terminal. The terminal includes a display screen, and the display screen includes a polarizing sheet as described in any embodiment of the first aspect of the present disclosure.

According to a fourth aspect of embodiments of the present disclosure, there is provided a terminal. The terminal includes a display screen and an optical component. The display screen includes a display panel and a polarizing sheet. The polarizing sheet includes a base layer; and a polarizing layer attached to the base layer. The polarizing layer includes a first region and a second region having a light transmission property superior to that of the first region. The optical component is disposed under the second region.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Figure 1:
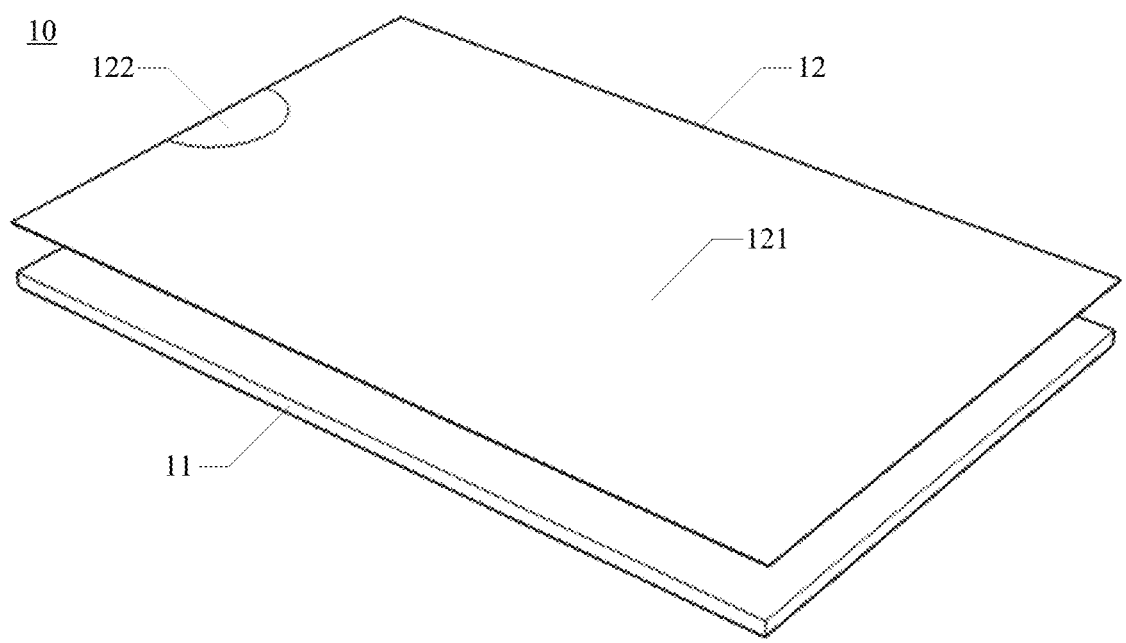
FIG. 1 is a schematic diagram of a polarizing sheet according to some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

In some embodiments, optical components (such as a camera, a light sensor, an infrared transmitter, an infrared receiver, etc.), which are traditionally disposed at a front panel of the mobile phone, can be disposed under the display screen, so as to release space of the front panel and improve a screen-to-body ratio of the mobile phone.

The inventors of the present disclosure have recognized that, due to poor light transmission property of the polarizing sheet, placement of these optical components under the display screen will affect working performances of these optical components or even cause these optical components not to work properly.

According to a first aspect of embodiments of the present disclosure, there is provided a polarizing sheet, including a base layer; and a polarizing layer attached to the base layer. The polarizing layer includes, in a same plane, a combination of any two or more of a first region, a second region and a third region. The first region, the second region and the third region have different light transmission properties.

In some embodiments, the first region is of transmittance lower than that of the second region; and the third region is of transmittance between that of the first region and that of the second region.

In some embodiments, the polarizing layer includes the first region having a polarizing function and the second region having no polarizing function.

In some embodiments, the first region includes a polarizing material having the polarizing function; and the second region does not include the polarizing material.

In some embodiments, the first region includes a first polarizing material having the polarizing function; and the second region includes a second polarizing material having no polarizing function.

In some embodiments, the second region having no polarizing function is obtained by deactivating the polarizing function of the second region by means of at least one of followings:

grinding the second polarizing material by a computerized numerical control (CNC) technology;

heating the second polarizing material;

etching the second polarizing material;

misaligning polarizing molecules of the second polarizing material; and irradiating the second polarizing material by ultraviolet.

In some embodiments, the polarizing layer includes the second region, and the second region is located at a top border of the polarizing layer; and/or the second region is located at a left border of the polarizing layer; and/or the second region is located at a right border of the polarizing layer; and/or the second region is located at a bottom border of the polarizing layer; and/or the second region is located at a middle part of the polarizing layer.

In some embodiments, the polarizing layer includes a combination of the first region, the second region and the third region, and the third region is located between the first region and the second region.

In some embodiments, the transmittance of the second region is greater than 50%.

In some embodiments, the polarizing sheet further includes a release film, a pressure sensitive adhesive (PSA) layer, a lower tri-acetyl cellulose (TAC) film, an upper TAC film, and a protective film from bottom to top, the base layer is located between the lower TAC film and the upper TAC film; and the polarizing layer is located between the base layer and the upper TAC film or located between the base layer and the lower TAC film; or the polarizing layer is located between the base layer and the upper TAC film and located between the base layer and the lower TAC film.

In some embodiments, the polarizing sheet is of an integrated structure and has a regular or irregular shape.

According to a second aspect of embodiments of the present disclosure, there is provided a display screen. The display screen includes a polarizing sheet as described in any embodiment of the first aspect of the present disclosure.

According to a third aspect of embodiments of the present disclosure, there is provided a terminal. The terminal includes a display screen, and the display screen includes a polarizing sheet as described in any embodiment of the first aspect of the present disclosure.

According to a fourth aspect of embodiments of the present disclosure, there is provided a terminal. The terminal includes a display screen and an optical component. The display screen includes a display panel and a polarizing sheet. The polarizing sheet includes a base layer; and a polarizing layer attached to the base layer. The polarizing layer includes a first region and a second region having a light transmission property superior to that of the first region. The optical component is disposed under the second region.

In some embodiments, the polarizing layer further includes a third region, and the third region is located between the first region and the second region, and has a light transmission property superior to that of the first region but inferior to that of the second region.

In some embodiments, the display panel includes a substrate; and a display layer disposed above the substrate. The display layer includes a first display region corresponding to the first region; and a second display region corresponding to the second region and having a light transmission property superior to that of the first display region. The optical component is disposed under the second display region.

In some embodiments, the polarizing layer further includes a third region located between the first region and the second region, and having a light transmission property superior to that of the first region but inferior to that of the second region; and the display layer further includes a third display region corresponding to the third region and located between the first display region and the second display region.

In some embodiments, the display panel is a liquid crystal display (LCD) panel, and the display screen includes an upper polarizing sheet located above the LCD panel and a lower polarizing sheet located under the LCD panel.

In some embodiments, the display panel is an organic light-emitting diode (OLED) display panel, and the polarizing sheet is located above the OLED display panel.

In some embodiments, the optical component includes at least one selected from a camera, a light sensor, a proximity sensor, an optical transmitter and an optical receiver.

According to a fifth aspect of embodiments of the present disclosure, there is provided a method for manufacturing a polarizing sheet, including: providing a base layer; and producing a polarizing layer on the base layer. The polarizing layer includes, in a same plane, a combination of any two or more of a first region, a second region and a third region. The first region, the second region and the third region have different light transmission properties.

In some embodiments, producing a polarizing layer on the base layer includes:

coating the base layer with an impregnation solution including a polarizing material;

providing a barrier layer on such a region of the base layer coated with the impregnation solution that corresponds to at least one of the second region and the third region;

orienting the base layer provided with the barrier layer by applying a magnetic field or by stretching, such that polarizing molecules in the polarizing material are aligned in a specified manner;

immobilizing and drying the polarizing material; and removing the barrier layer to obtain the polarizing layer on the base layer.

In some embodiments, producing a polarizing layer on the base layer includes:

providing a barrier layer on such a region of the base layer that corresponds to at least one of the second region or the third region;

coating the base layer having the barrier layer with an impregnation solution including a polarizing material;

orienting the base layer coated with the impregnation solution by applying a magnetic field or by stretching, such that polarizing molecules in the polarizing material are aligned in a specified manner;

immobilizing and drying the polarizing material; and removing the barrier layer to obtain the polarizing layer on the base layer.

In some embodiments, providing a barrier layer on the base layer includes:

coating the base layer with a barrier layer material that is removable by exposure; and removing the barrier layer material at a target region by exposure or by rinsing to obtain the barrier layer at a remaining region.

In some embodiments, the barrier layer includes a grid-shaped frame and a projection part located in each compartment of the frame and connected with the frame.

In some embodiments, the barrier layer is removed by at least one of the followings:

peeling off the barrier layer;

rinsing away the barrier layer; and subjecting the barrier layer to exposure.

In some embodiments, producing a polarizing layer on the base layer includes:

coating the base layer with an impregnation solution including a polarizing material;

orienting the base layer coated with the impregnation solution by applying a magnetic field or by stretching, such that polarizing molecules in the polarizing material are aligned in a specified manner;

immobilizing and drying the polarizing material to obtain a polarizing precursor layer; and treating a specified region of the polarizing precursor layer to make the specified region lose a polarizing function or to weaken the polarizing function of the specified region, the specified region includes at least one of the second region or the third region.

In some embodiments, treating a specified region of the polarizing precursor layer includes one or more of the followings:

grinding off the polarizing material in the specified region by a CNC technology;

destroying the polarizing function of the polarizing material in the specified region by local heating;

destroying the polarizing function of the polarizing material in the specified region by local corrosion;

destroying the polarizing function of the polarizing material in the specified region by applying a magnetic field; and destroying the polarizing function of the polarizing material in the specified region by ultraviolet irradiation.

Various embodiments of the present disclosure may have one or more of the following beneficial effects.

With the polarizing sheet according to embodiments of the present disclosure, by forming the polarizing layer on the base layer, and producing at least one of the second region or the third region with better light transmission property in the polarizing layer through a manufacturing process, an optical component (such as a camera, a light sensor, etc.) may be set under at least one of the second region or the third region and is able to work properly. As a result, the working performance of the optical component under the display screen may be ensured to the greatest extent.

FIG. 1 is a schematic diagram of a polarizing sheet according to some embodiments of the present disclosure.

As illustrated in FIG. 1, the polarizing sheet 10 includes a base layer 11 and a polarizing layer 12 attached to the base layer 11.

The polarizing sheet 10 is in a laminated structure. The base layer 11 is configured to support the polarizing layer 12. The polarizing layer 12 is configured to realize a polarizing function.

In some embodiments, the polarizing layer 12 is located above the base layer 11, i.e., the polarizing layer 12 is attached to an upper surface of the base layer 11. In some embodiments, the polarizing layer 12 is located under the base layer 11, i.e., the polarizing layer 12 is attached to a lower surface of the base layer 11.

In some embodiments, the polarizing sheet 10 includes two polarizing layers 12, of which one is located above the base layer 11 (i.e., attached to the upper surface of the base layer 11), and the other one is located under the base layer 11 (i.e., attached to the lower surface of the base layer 11).

In some embodiments of the present disclosure, the polarizing layer 12 includes, in a same plane, a combination of any two or more of a first region, a second region or a third region. The first region, the second region and the third region can have different light transmission properties.

For example, when the same lights are respectively irradiated to the first region, the second region and the third region, exit lights respectively passing through the first region, the second region and the third region are different in their wavelengths, amplitudes or phases.

In some embodiments, the light transmission property characterizes an ability of a medium to transmit lights and is expressed by transmittance. The transmittance, also known as transmissivity, is a percentage of a light flux passing through a medium (such as the first region, the second region and the third region as described in some embodiments of the present disclosure) to an incident light flux.

In some embodiments, transmittance of the first region is lower than that of the second region; and transmittance of the third region is between that of the first region and that of the second region. For example, the transmittance of the first region is lower than a first transmittance threshold, the transmittance of the second region is greater than a second transmittance threshold, and the first transmittance threshold is equal to or less than the second transmittance threshold.

In some embodiments, the first transmittance threshold is equal to the second transmittance threshold, for example, the first transmittance threshold and the second transmittance threshold are both equal to 50%, then the transmittance of the first region is lower than 50%, and the transmittance of the second region is greater than 50%.

In some embodiments, the first transmittance threshold is lower than the second transmittance threshold, for example, the first transmittance threshold is 50%, and the second transmittance threshold is 60%, then the transmittance of the first region is lower than 50%, and the transmittance of the second region is greater than 60%.

In some embodiments of the present disclosure, the first region refers to a part of the polarizing layer 12 having a polarizing function. In a case where the polarizing layer 12 includes the first region, the polarizing layer 12 may include one first region or a plurality of the first regions.

It should be noted that, the expressions "having a polarizing function," "having the polarizing function" and variants and equivalents thereof as used herein may refer to only allowing a light in a certain direction to pass through or only transmitting a light in a certain direction, for example, only transmitting the light in 90 degrees, while not allowing lights in other directions except 90 degrees to pass through; in some embodiments, may also refer to only allowing lights in a certain range of [a degree, b degree] to pass through or only transmitting lights in a certain range of [a degree, b degree], and a difference between a and b is not greater than a first threshold. For example, if the first threshold is 5 degree, lights such as in a range of [0 degree, 5 degrees] are allowed to pass through, and lights in other directions except the range of [0 degree, 5 degrees] are not allowed to pass through.

The second region refers to a part of the polarizing layer 12 having no polarizing function. In a case where the polarizing layer 12 includes the second region, the polarizing layer 12 may include one second region or a plurality of the second regions.

It should be noted that, the expressions "having no polarizing function," "not having polarizing function," and variants and equivalents thereof as used herein may refer to not having the polarizing function at all, i.e., allowing lights in any direction to pass through; in some embodiments, may also refer to having a certain degree of polarizing function, but the polarizing function is poor, for example, allowing lights in a range of [c degree, d degree] to pass through, in which a difference between c and d is not less than a second threshold, and the second threshold is greater than or equal to the first threshold. For example, if the second threshold is 30 degree, lights such as in a range of [0 degree, 30 degrees] are allowed to pass through, and lights in other directions except the range of [0 degree, 30 degrees] are not allowed to pass through.

The third region refers to such a part of the polarizing layer 12 that has the polarizing function, but the polarizing function is destroyed. That is, the polarizing function of the third region is between that of the first region and that of the second region, i.e., the polarizing function of the third region is inferior to that of the first region but superior to that of the second region.

In some embodiments, a part of the third region has the polarizing function, and another part of the third region does not have the polarizing function. In a case where the polarizing layer 12 includes the third region, the polarizing layer 12 may include one third region or a plurality of the third regions. In some embodiments, the third region is located between the first region and the second region and used as a transitional region between the first region and the second region.

In some embodiments of the present disclosure, the polarizing function is achieved by a polarizing material which, for example, may be an iodine molecular material or other materials having a polarizing characteristic.

Figure 2:
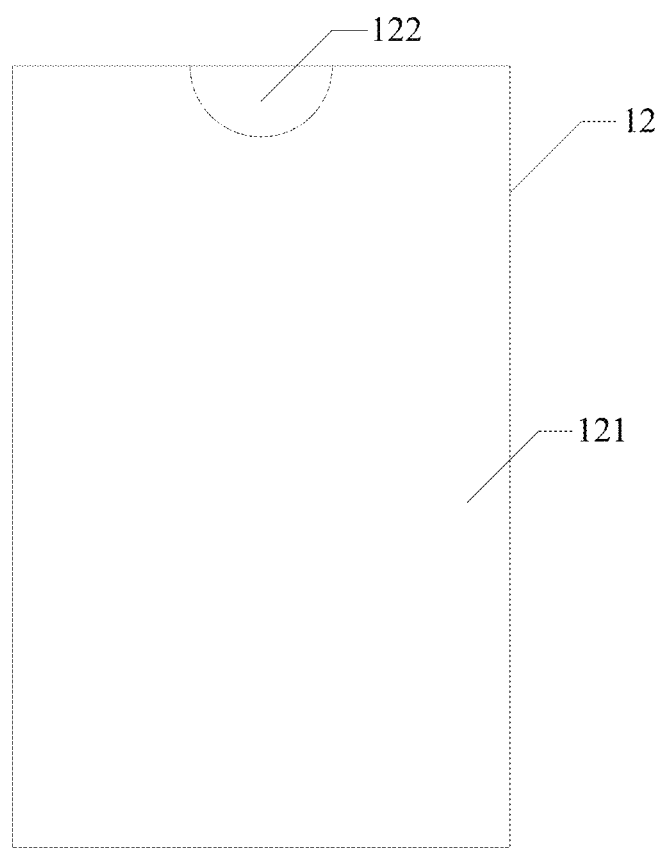
FIG. 2 is a schematic diagram of a polarizing layer of the polarizing sheet illustrated in FIG. 1.

In some embodiments, as illustrated in FIG. 1 and FIG. 2, the polarizing layer 12 includes a first region 121 and a second region 122. Transmittance of the first region 121 is lower than that of the second region 122. The first region 121 has a polarizing function, and the second region 122 does not have the polarizing function. In an implementation, the first region 121 includes a polarizing material, and the polarizing material has the polarizing function; the second region 122 does not include the polarizing material.

For example, the first region 121 includes an iodine molecular material, and iodine molecules in the iodine molecular material have the polarizing characteristic and are aligned in a specified manner, as a result, the first region 121 has the polarizing function; the second region 122 does not include the iodine molecular material and thus does not have the polarizing function. In another implementation, the first region 121 includes a first polarizing material which has the polarizing function; and the second region 122 includes a second polarizing material which does not have the polarizing function.

For example, the first region 121 includes an iodine molecular material, and iodine molecules in the iodine molecular material have the polarizing characteristic and are aligned in a specified manner, as a result, the first region 121 has the polarizing function; the second region 122 also includes an iodine molecular material, and iodine molecules in the iodine molecular material have the polarizing characteristic, but are not aligned in a specified manner, as a result, the second region 122 does not have the polarizing function.

In some embodiments of the present disclosure, the second region 122 having no polarizing function is obtained by deactivating the polarizing function of the second polarizing material by means of at least one of followings:

grinding the second polarizing material by a CNC technology;

heating the second polarizing material;

etching the second polarizing material;

misaligning polarizing molecules of the second polarizing material; and irradiating the second polarizing material by ultraviolet.

In addition, the second region 122 may be located at one or more parts selected from a top border, a bottom border, a right border, a left border and a middle part of the polarizing layer 12.

In some embodiments, the second region 122 is located at the top border of the polarizing layer 12, as illustrated in FIG. 2.

Figure 3:
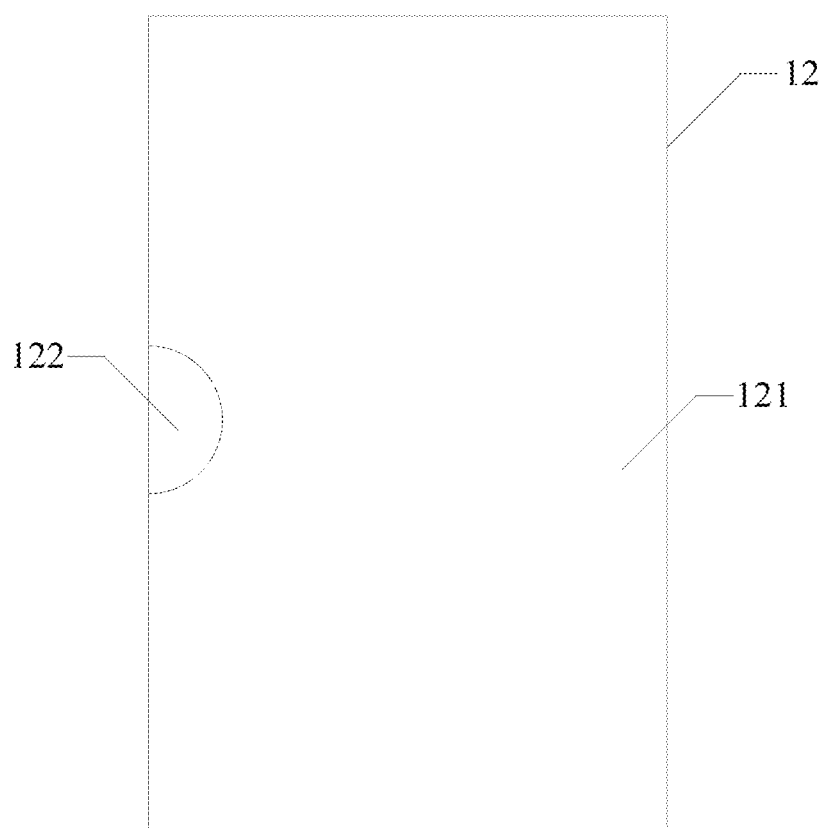
FIG. 3 is a schematic diagram of a polarizing layer according to some embodiments of the present disclosure.

In some embodiments, the second region 122 is located at the left border of the polarizing layer 12, as illustrated in FIG. 3.

Figure 4:
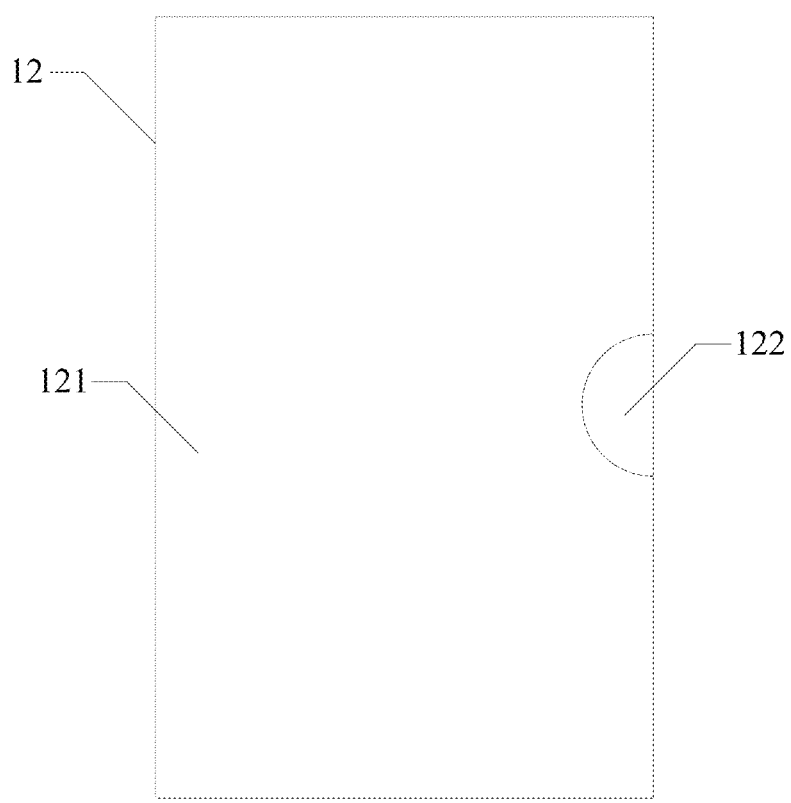
FIG. 4 is a schematic diagram of a polarizing layer according to some embodiments of the present disclosure.

In some embodiments, the second region 122 is located at the right border of the polarizing layer 12, as illustrated in FIG. 4.

Figure 5:
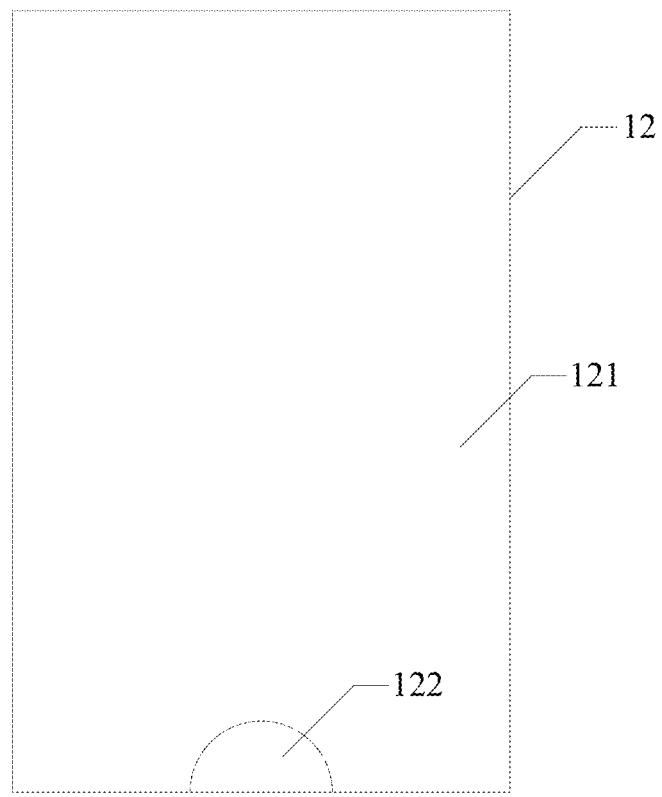
FIG. 5 is a schematic diagram of a polarizing layer according to some embodiments of the present disclosure.

In some embodiments, the second region 122 is located at the bottom border of the polarizing layer 12, as illustrated in FIG. 5.

Figure 6:
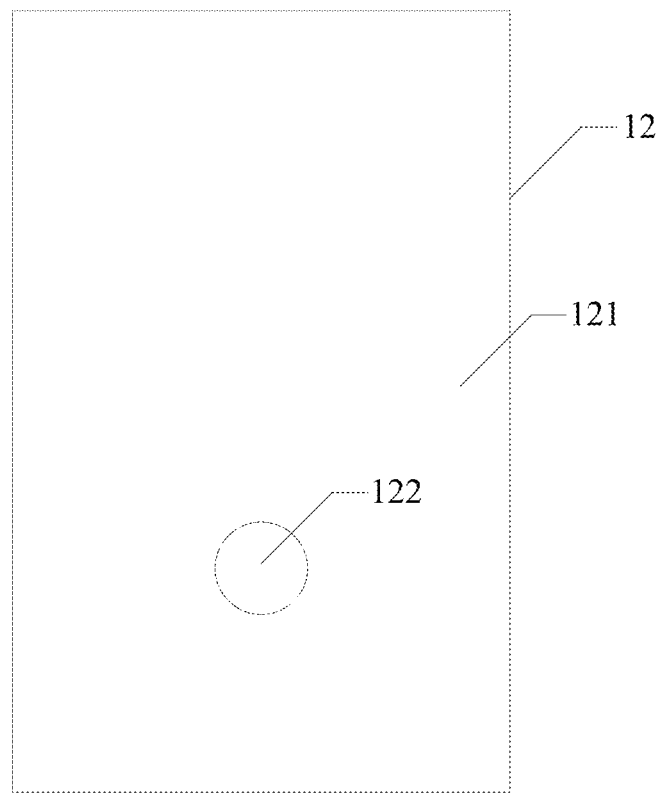
FIG. 6 is a schematic diagram of a polarizing layer according to some embodiments of the present disclosure.

In some embodiments, the second region 122 is located at the middle part of the polarizing layer 12, as illustrated in FIG. 6.

In the above embodiments as illustrated in FIGS. 1-6, the polarizing layer 12 includes one first region 121 and one second region 122. In some other embodiments, the polarizing layer 12 may include a plurality of the first regions 121 and/or a plurality of the second regions 122.

Figure 7:
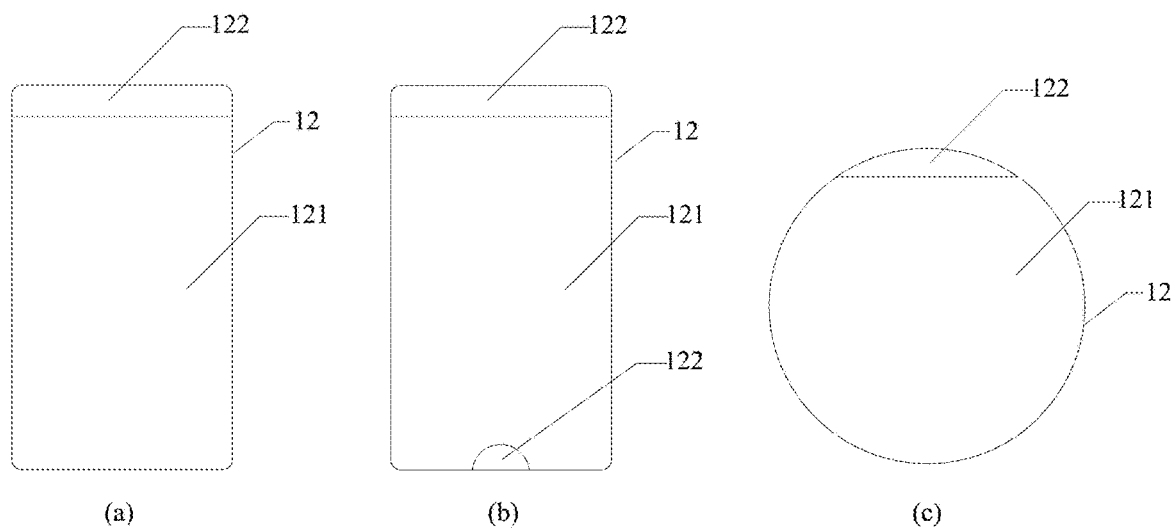
FIG. 7 is a schematic diagram of a polarizing layer according to some embodiments of the present disclosure.

For example, schematic diagrams of several implementations of the polarizing layer 12 are illustrated in FIG. 7, respectively in panels (a), (b), and (c).

In some embodiments, the first region 121 is larger than the second region 122 in size. The first region 121 may have a regular or irregular shape and has at least one notch, and the second region 122 is located at the notch. For example, as illustrated in FIG. 2, the first region 121 has a rectangular shape and has one notch, and the second region 122 is located at the notch. In addition, in some embodiments of the present disclosure, there is no limitation to a cross-sectional shape of the second region 122, which may have a regular shape such as a rectangle, a rounded rectangle, a circle, a semicircle, or has an irregular shape such as a teardrop shape or an arc-shape, etc.

Figure 8:
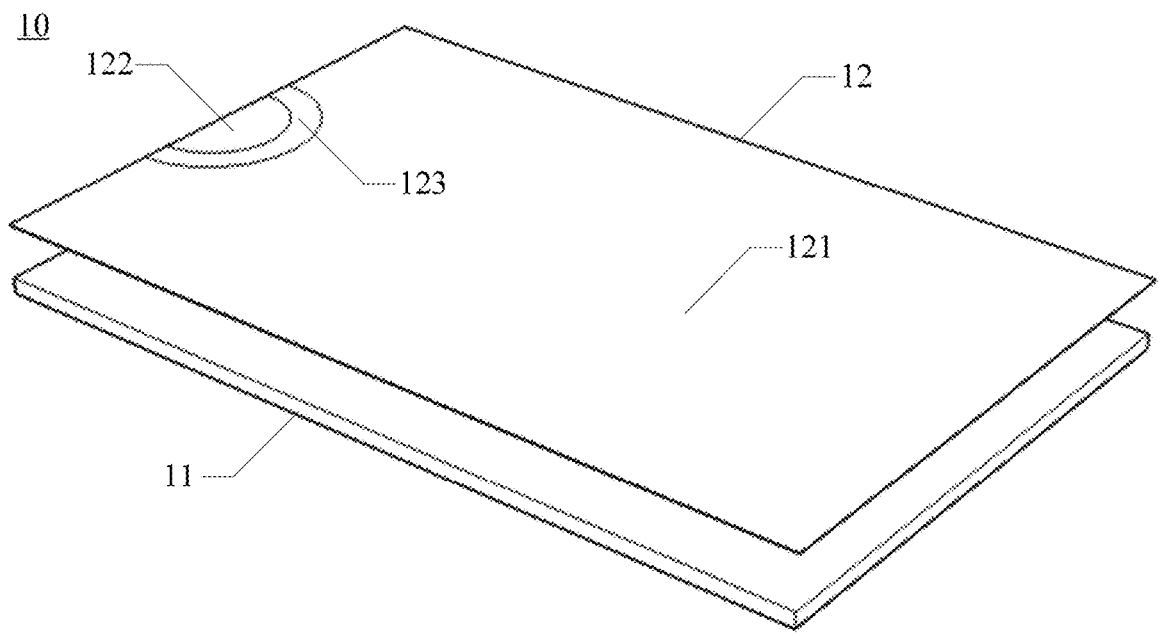
FIG. 8 is a schematic diagram of a polarizing sheet according to some embodiments of the present disclosure.
Figure 9:
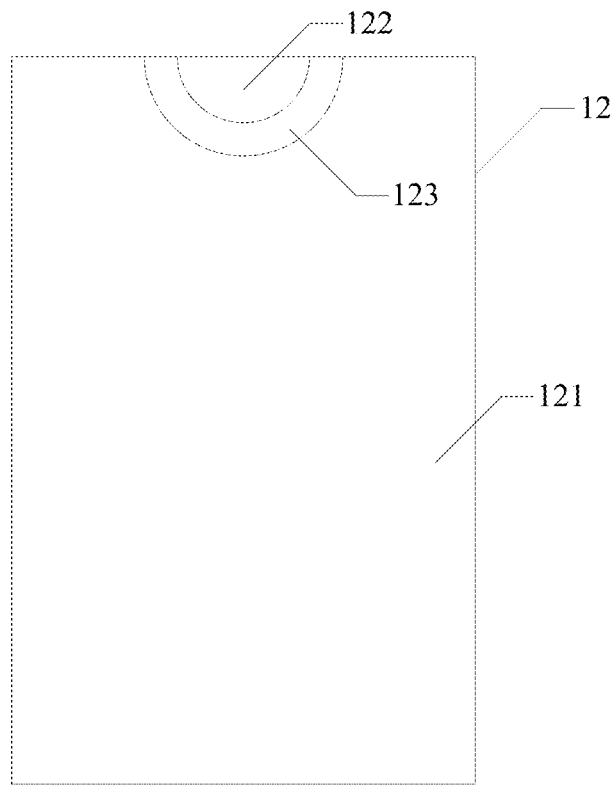
FIG. 9 is a schematic diagram of a polarizing layer of the polarizing sheet illustrated in FIG. 8.

In another embodiment, as illustrated in FIG. 8 and FIG. 9, the polarizing layer 12 includes a first region 121, a second region 122, and a third region 123.

The third region 123 is located between the first region 121 and the second region 122 and used as a transitional region between the first region 121 and the second region 122.

The first region 121 is of transmittance lower than that of the second region 122, and the third region 123 is of transmittance between that of the first region 121 and that of the second region 122.

The first region 121 has a polarizing function, and the second region 122 does not have the polarizing function. The third region 123 has the polarizing function, but the polarizing function is destroyed. That is, the polarizing function of the third region 123 is between that of the first region 121 and that of the second region 122, i.e., the polarizing function of the third region 123 is inferior to that of the first region 121 but superior to that of the second region 122. In some embodiments, a part of the third region 123 has the polarizing function, and another part thereof does not.

Further, in some embodiments of the present disclosure, the polarizing sheet 10 is of an integrated structure, that means the base layer 11 of the polarizing sheet 10 is of an integrated structure, and the different types of regions included in the polarizing layer 12 are formed on a complete base layer 11. The base layer 11 may be a polyvinyl alcohol (PVA) film, which has characteristics of high transparency, high extensibility, excellent iodine adsorption, and good film-forming property.

Further, the polarizing sheet 10 has a regular or irregular shape. For example, the polarizing sheet 10 may have a regular shape such as a rectangle, a rounded rectangle, a circle, or some other irregular shapes.

In some embodiments, in addition to the base layer 11 and the polarizing layer 12 as described above, the polarizing sheet 10 further includes at least one of a TAC film, a protective film, a PSA layer, and a release film.

Figure 10:
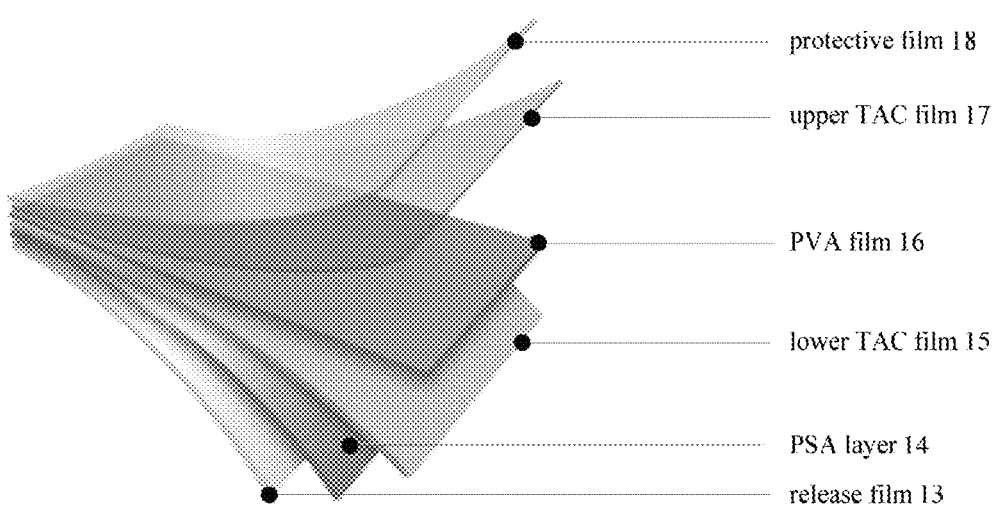
FIG. 10 is a schematic diagram illustrating a laminated structure of a polarizing sheet according to some embodiments of the present disclosure.

In some embodiments, as illustrated in FIG. 10 which is a schematic diagram of a laminated structure of the polarizing sheet 10, the polarizing sheet 10 includes a release film 13, a PSA layer 14, a lower TAC film 15, a PVA film 16, an upper TAC film 17 and a protective film 18 from bottom to top.

The PVA film 16 acts as the above-described base layer 11 and is provided with the above-described polarizing layer 12 thereon. In some embodiments, the polarizing layer 12 is located between the PVA film 16 and the upper TAC film 17. In another embodiment, the polarizing layer 12 is located between the PVA film 16 and the lower TAC film 15.

In yet some other embodiments, there are two polarizing layers 12, of which one is located between the PVA film 16 and the upper TAC film 17, and the other one is located between the PVA film 16 and the lower TAC film 15.

FIG. 10 only illustrates one implementation of the laminated structure of the polarizing sheet 10, and in some other embodiments, certain layer(s) may be added, reduced or replaced as required, which will not be limited herein.

In addition, some examples of the properties and functions of individual layers of the polarizing sheet 10 are listed in Table 1.

TABLE 1

Polarizing sheet layer properties and functions

| Types | Properties | Functions |
|---|---|---|
| PVA film | PVA: having characteristics of high transparency, high extensibility, excellent iodine adsorption, and good film-forming property, etc. PVA film: having a thickness before extension of 75 μm, 60 μm, 45 μm, etc. | This film is aligned by extension after adsorbing iodine molecules having a dichroic absorption characteristic to play the polarizing function, which is a core part of the polarizing sheet, and determines optical indexes of the polarizing sheet, including polarizing performance, transmittance, color tone, etc. |
| TAC film | Characteristics: excellent supportability, optical homogeneity, high transparency, acid and alkali resistance, and ultraviolet resistance, etc. Thickness: 80 μm, 60 μm, 40 μm, 25 μm, etc. | On the one hand, the TAC film is used as a support of the PVA film, ensuring the extended PVA film not to retract, and on the other hand, the TAC film protects the PVA film from moisture, ultraviolet and other foreign substances, ensuring the environmental resistance of the polarizing sheet. |
| Protective film | Characteristics: high strength, good transparency, acid and alkali resistance, anti-static, etc. Thickness: 58 μm, in general | The protective film is coated with pressure sensitive adhesive on one side thereof and is attached to the polarizing sheet to protect the polarizing sheet from an external force. |
| PSA layer | Characteristics: good adhesion to the TAC film, good transparency, and less residue. Thickness of the PSA layer for the polarizing sheet is generally about 20 μm. | PSA is an adhesive material to attach the polarizing sheet to a display panel, and determines an adhesion performance of the polarizing sheet and processing performances of sheets bonded thereby. |
| Release film | Polyethylene terephthalate (PET) film coated with a silicon coating on single side, having characteristics of high strength, non-deformation, good transparency, high surface flatness, etc., and having different peel strengths for different applications. | The release film protects the PSA layer from damage and avoids the generation of bonding bubbles, before the polarizing sheet is attached to display panel. |

It should be noted that, the polarizing sheet 10 according to embodiments of the present disclosure is applicable to various types of display screens, including but not limited to an LCD or an OLED display screen, such as a rigid Active-matrix Organic Light-Emitting Diode (AMOLED) display screen, a flexible AMOLED display screen, etc.

It should be noted that, even though descriptions are mainly made to embodiments where the polarizing layer 12 includes the first region 121 and the second region 122, and to embodiments where the polarizing layer 12 includes the first region 121, the second region 122 and the third region 123, in some other embodiments, the polarizing layer 12 may include a combination of any two or more of the first region 121, the second region 122 and the third region 123, for example, the polarizing layer 12 includes a combination of the first region 121 and the third region 123, which will not be limited herein.

As such, with the polarizing sheet according to embodiments of the present disclosure, by forming the polarizing layer on the base layer, and producing at least one of the second region or the third region with better light transmission property in the polarizing layer through a manufacturing process, an optical component (such as a camera, a light sensor, etc.) may be set under at least one of the second region or the third region and is able to work properly. As a result, the working performance of the optical component under the display screen may be ensured to the greatest extent.

Figure 11:
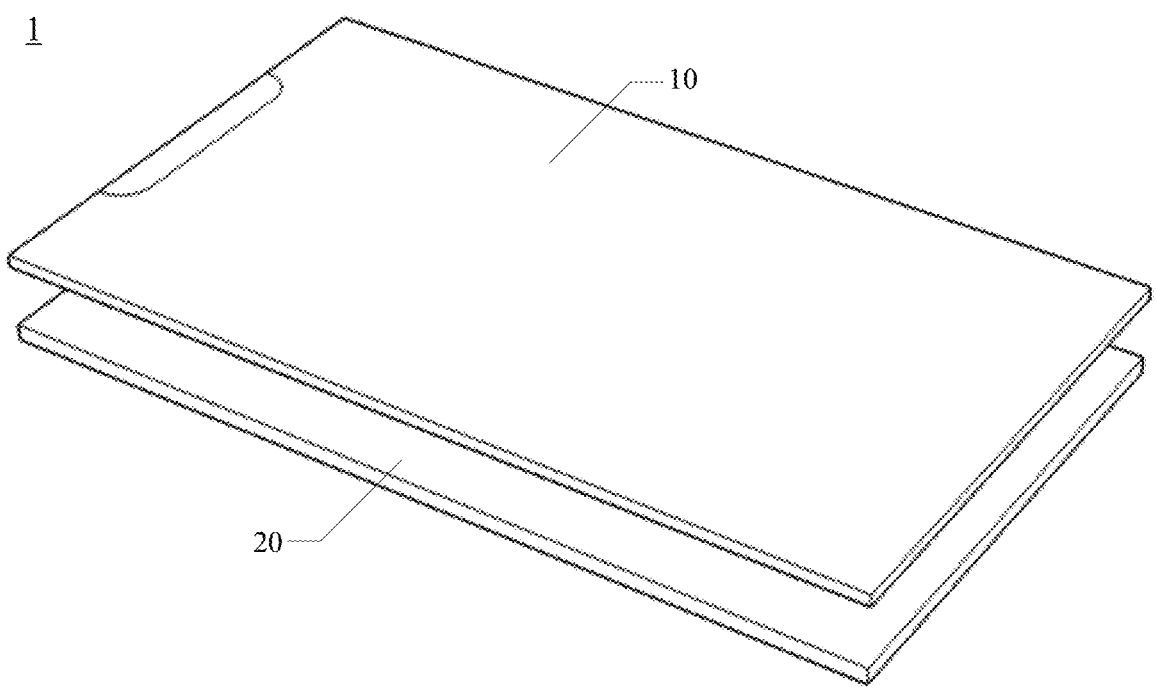
FIG. 11 is a schematic diagram of a display screen according to some embodiments of the present disclosure.

In some embodiments of the present disclosure, there is provided a display screen which includes the polarizing sheet as described hereinbefore. As illustrated in FIG. 11, the display screen 1 includes a polarizing sheet 10 and a display panel 20.

The display panel 20 is configured to have an image displaying function, and may be an LCD panel, an OLED display panel, or other types of display panels, which will not be limited herein.

The polarizing sheet 10 is configured to play a light filtering function, so as to ensure that the display panel 20 is capable of displaying images.

For different types of display screens, the number of the polarizing sheet 10 needed may be different. For example, when the display screen 1 is an LCD (i.e., the display panel 20 is the LCD panel), the LCD includes two polarizing sheets 10, of which one is located under the LCD panel and known as a lower polarizing sheet, and the other one is located above the LCD panel and known as an upper polarizing sheet. For another example, when the display screen 1 is an OLED display screen (i.e., the display panel 20 is the OLED display panel), the OLED display screen includes one polarizing sheet 10 located above the OLED display panel.

In some embodiments of the present disclosure, there is provided a terminal, which may be an electronic device, such as a mobile phone, a tablet, an e-book reader, a multimedia player, a wearable device, a vehicle terminal, etc. The terminal includes a display screen that includes a polarizing sheet as described hereinbefore.

Figure 12:
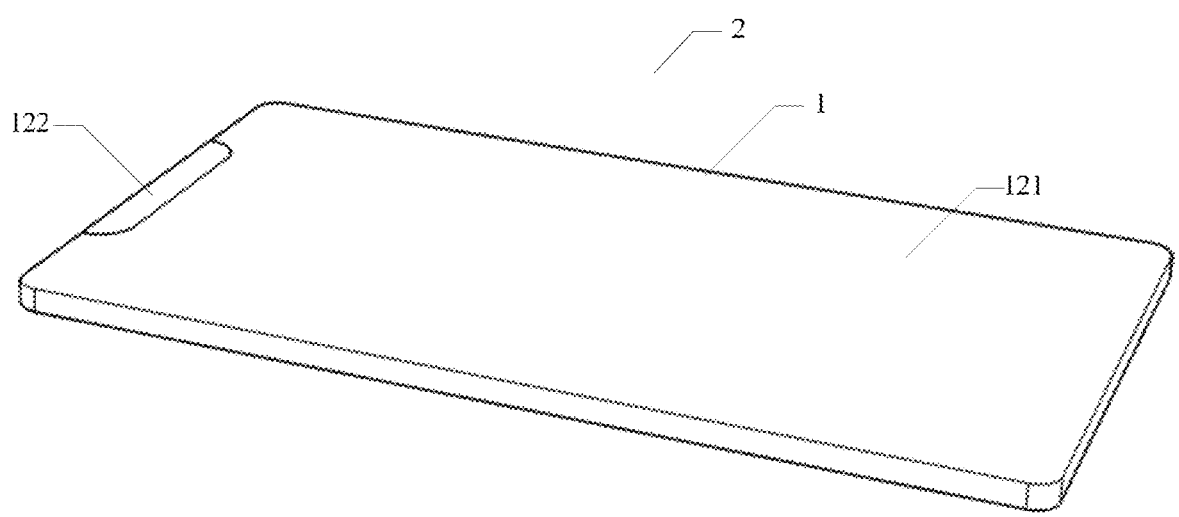
FIG. 12 is a schematic diagram of a terminal according to some embodiments of the present disclosure.

In some embodiments, as illustrated in FIG. 12, the terminal 2 includes a display screen 1, the display screen 1 includes a display panel and a polarizing sheet (not shown in FIG. 12). The polarizing sheet is located above the display panel, for example, the polarizing sheet is located above and attached to the display panel.

The polarizing sheet includes a base layer and a polarizing layer attached to the base layer. As illustrated in FIG. 12, the polarizing layer includes a first region 121 and a second region 122, and the second region 122 is of a light transmission property superior to that of the first region 121. In some embodiments, the polarizing layer further includes a third region. Descriptions regarding the polarizing sheet may be referred to the related embodiments as described hereinbefore, and will not be elaborated here.

Figure 13:
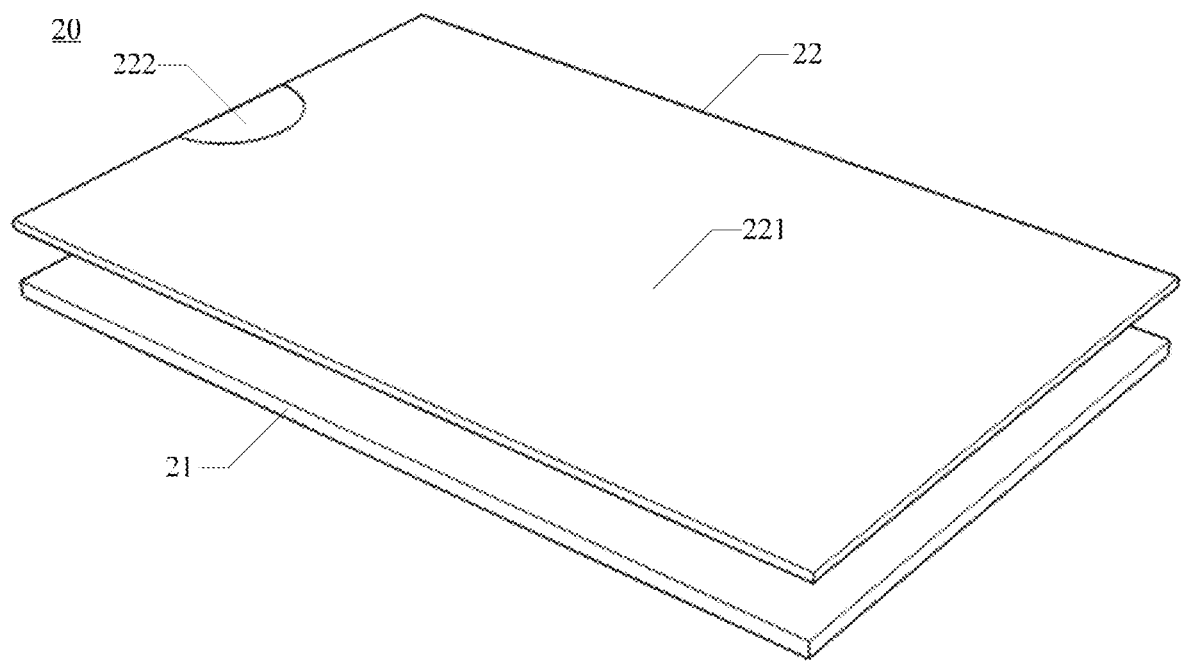
FIG. 13 is a schematic diagram of a display panel according to some embodiments of the present disclosure.

In some embodiments, as illustrated in FIG. 13 which is a schematic diagram of a display panel 20 according to some embodiments of the present disclosure, the display panel 20 includes a substrate 21 and a display layer 22 located above the substrate 21.

The display layer 22 is configured to realize an image displaying function. In some embodiments, the display layer 22 includes a first display region 221 as a main display region; and a second display region 222 as an auxiliary display region. The first display region 221 and the second display region 222 both have a displaying function. In some embodiments of the present disclosure, the display layer 22 may include one second display region 222 or a plurality of the second display regions 222. Referring to FIG. 13, some embodiments where the display layer 22 includes one second display region 222 is illustrated. Even the display layer 22 includes two different types of display regions, i.e., the first display region 221 and the second display region 222, the first display region 221 and the second display region 222 are physically integrated, i.e., the display layer 22 has an integrated structure, and is not divided into several independent parts.

If the display layer 22 includes several independent parts, and these independent parts are spliced to form the display layer 22, there must be a certain gap at splicing positions, which finally results in gaps present between display contents of individual parts, and integral and gapless displaying effect of the whole display layer 22 cannot be achieved. However, in some embodiments of the present disclosure, the first display region 221 and the second display region 222 are a unified whole in physical structure, and no gap is present there between, as a result, there is no gap between the display content of the first display region 221 and that of the second display region 222, thereby achieving the integral and gapless displaying effect of the content of the whole display layer 22.

Further, the substrate 21 is of an integrated structure, that means the first display region 221 and the second display region 222 are formed on a complete substrate. In some embodiments, the substrate 21 includes a first substrate region corresponding to the first display region 221; and a second substrate region corresponding to the second display region 222. If the first substrate region and the second substrate region are made of a same material, the substrate 21 is a complete substrate made of the same material. If the first substrate region and the second substrate region are made of different materials, the first substrate region and the second substrate region may be spliced by a related process to form an integrated substrate 21 with no gap at the splicing position.

In some embodiments, the second display region 222 is of a light transmission property superior to that of the first display region 221. For example, transmittance of the second display region 222 is greater than that of the first display region 221. The light transmission property of the second display region 222 may be improved by a related manufacturing process.

For example, a luminescent control component (such as a driving circuit, a Thin-Film Transistor (TFT), a storage capacitor, and the like) for controlling sub-pixels in the second display region 222 is set outside the second display region 222, such that the transmittance of the second display regions 222 may be improved. For another example, at least one sub-pixel sequence is formed in the second display region 222, each of the at least one sub-pixel sequence includes at least two sub-pixels, and individual sub-pixels included in any sub-pixel sequence have the same color.

In this way, sub-pixels of the same color may share the same control trace (also known as signal feed), the number of control traces in the second display region 222 may be reduced, and layout of the control traces is optimized, so that the number of the luminescent control component such as the storage capacitor and the TFT in the second display region 222 is reduced, and thus the transmittance of the second display region 222 is improved. For yet another example, sizes of sub-pixels in the second display region 222 are set to be larger than that of sub-pixels in the first display region 221, so that a pixel distribution density in the second display region 222 is less than that of the first display region 221. In this way, the number of the control traces in the second display region 222 may be reduced as much as possible, the layout of the control traces may be optimized, and a Pixel Delineation Layer (PDL) between pixels may become as large and regular as possible in shape, thereby enabling light transmission regions (including regions occupied by the sub-pixels and the PDL) in the second display region 222 to possess a better light transmission property.

In some embodiments, the first display region 221 corresponds to the first region 121, and the second display region 222 corresponds to the second region 122. That is, the first display region 221 has a size and shape same as or similar to that of the first region 121, and a projection area of the first display region 221 in a direction perpendicular to the display screen coincides with that of the first region 121 in the direction perpendicular to the display screen.

The second display region 222 has a size and shape same as or similar to that of the second region 122, and a projection area of the second display region 222 in the direction perpendicular to the display screen coincides with that of the second region 122 in the direction perpendicular to the display screen.

In some embodiments, in the case where the polarizing layer further includes the third region, the display layer may further include a third display region corresponding to the third region. The third display region is located between the first display region and the second display region and used as a transitional display region between the first display region and the second display region.

The third display region has a size and shape same as or similar to that of the third region, and a projection area of the third display region in the direction perpendicular to the display screen coincides with that of the third region in the direction perpendicular to the display screen. The third display region has a pixel distribution pattern different from that of the first display region and that of the second display region. For example, sizes of sub-pixels in the third display region are larger than that of the sub-pixels in the first display region but smaller than that of the sub-pixels in the second display region. The individual sub-pixels in the third display region may have the same or different size. For example, the closer the sub-pixel in the third display region to the second display region is, the larger the size of the sub-pixel is, and the closer the sub-pixel in the third display region to the first display region is, the smaller the size of the sub-pixel is. By this way, the resolution transition between the first display region and the second display region may be smoother and more natural, and the displaying effect of the entire terminal screen is improved.

In some embodiments of the present disclosure, an optical component (not shown in FIG. 12) is disposed under the second region 122. The optical component refers to such a functional component that needs to receive and/or transmit lights in operation. The optical component includes, but is not limited to, at least one selected from a camera, a light sensor, a proximity sensor, an optical transmitter and an optical receiver. In some embodiments, in the case where the display layer of the display panel includes the second display region corresponding to the second region, the optical component is disposed under the second display region.

Further, considering that a distance between the display layer and the substrate is small, which, for example, may be only 0.1 mm, it is unlikely to dispose the optical component between the display layer and the substrate. In some embodiments, the optical component is disposed under the substrate, that is, the optical component and the display screen are laminated, and the optical component is located under the display screen, thereby not occupying space of the display screen. Of course, in some embodiments, if the optical component is of a smaller thickness, it is also possible to arrange the optical component between the display layer and the substrate, which is not limited herein.

The display screen according to embodiments of the present disclosure may be an LCD display screen or an OLED display screen. When the display screen is the OLED display screen, the display screen may be a flexible display screen or a non-flexible display screen.

When the display screen is the LCD display screen, the display layer of the LCD panel may include a TFT array, a liquid crystal layer, and a color filter (CF) arranged in sequence from bottom to top. The substrate located under the display layer may be made of a glass material and referred to as a lower substrate. Typically, above the display layer, there is also provided an upper substrate, which may also be made of a glass material. In addition, in some embodiments of the present disclosure, a lower polarizing sheet may be disposed under the lower substrate, and an upper polarizing sheet may be disposed above the upper substrate. Moreover, the LCD display screen further includes a backlight module located under the lower polarizing sheet.

When the display screen is the OLED display screen, the display layer of the OLED display panel may include an indium tin oxide (ITO) anode, a hole transport layer, an organic luminescent layer, an electron transport layer, and a metal cathode arranged in sequence from bottom to top. The substrate located under the display layer may be made of a glass material, a plastic, a metal foil or other materials. The polarizing sheet is disposed above the OLED display panel.

It should be noted that, the above descriptions with respect to layer structures of the LCD display screen and the OLED display screen are merely exemplary and explanatory, and shall not be construed to limit the present disclosure.

In some embodiments of the present disclosure, by arranging the optical component under the display screen, space of a front panel of the terminal is released, and a screen-to-body ratio of the terminal is increased to be closer to or even reach 100%. Further, since the second region of the polarizing layer has a superior light transmission property, arranging the optical component under the second region may guarantee the working performance of the optical component under the display screen to the greatest extent.

In some embodiments of the present disclosure, there is further provided a method for manufacturing a polarizing sheet. It should be noted that, the polarizing sheet manufactured by the method may be any polarizing sheet as described hereinbefore.

In the following, the method for manufacturing the polarizing sheet will be described with reference to several embodiments.

Figure 14:
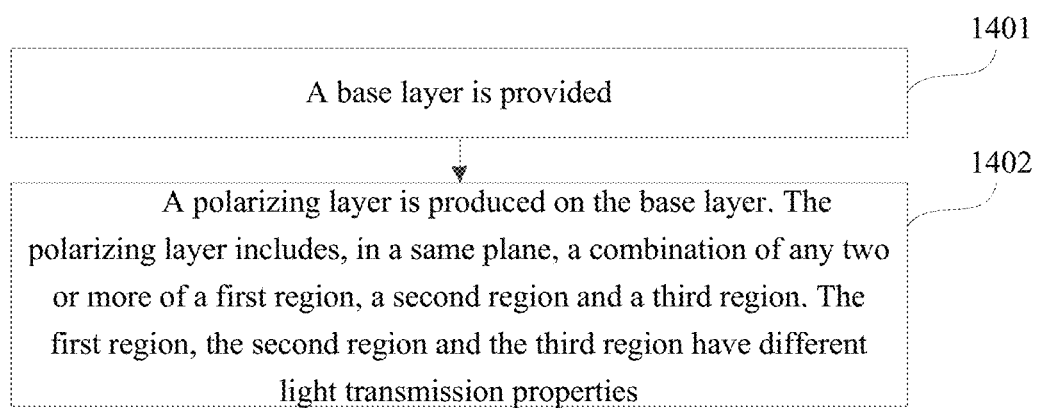
FIG. 14 is a flow chart of a method for manufacturing a polarizing sheet according to some embodiments of the present disclosure.

FIG. 14 is a flow chart of a method for manufacturing a polarizing sheet according to some embodiments of the present disclosure. As shown in FIG. 14, the method may include the following operations as illustrated at blocks of FIG. 14.

At operation 1401, a base layer is provided.

In some embodiments, the base layer is a PVA film. The base layer may be used to manufacture one polarizing sheet, or may be used to manufacture a plurality of polarizing sheets. When the base layer is used to manufacture a plurality of the polarizing sheets, the plurality of the polarizing sheets may be separated from each other by cutting or tailoring in a subsequent process.

At operation 1402, a polarizing layer is produced on the base layer. The polarizing layer includes, in a same plane, a combination of any two or more of a first region, a second region or a third region. The first region, the second region and the third region have different light transmission properties.

With respect to the polarizing layer and the individual regions in the polarizing layer, reference may be made to embodiments described hereinbefore, which will not be elaborated herein.

Figure 15:
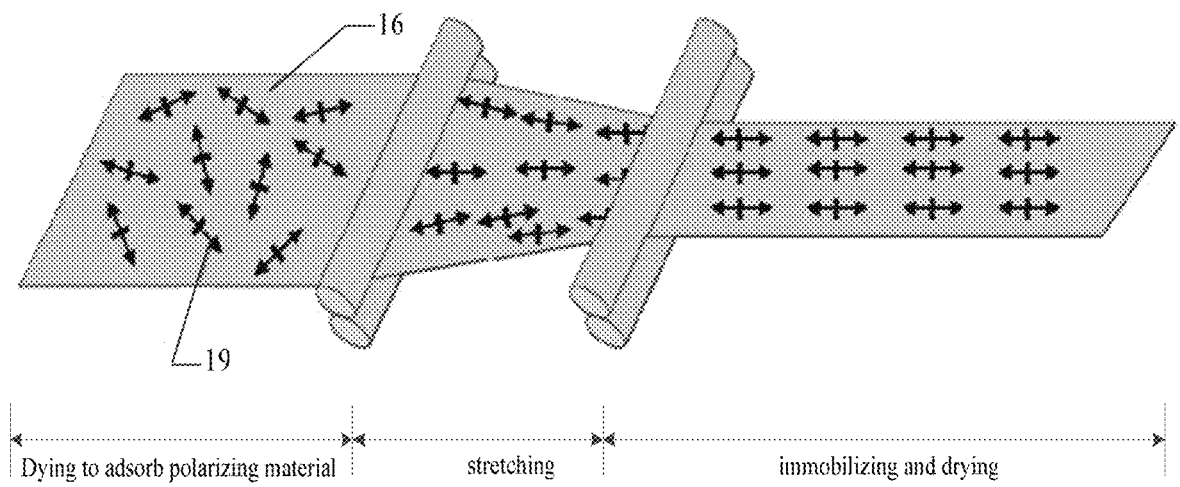
FIG. 15 is a schematic diagram illustrating a manufacturing process of a polarizing layer according to some embodiments of the present disclosure.

As illustrated in FIG. 15, a PVA film 16 is dyed to adsorb a polarizing material 19 having a dichroic absorption function, by stretching the PVA film 16, molecules in the polarizing material 19 are aligned orderly on the PVA film 16, afterwards, the polarizing material 19 is immobilized and dried to form the polarizing layer having uniform dichroic absorption function. A transmission axis of the polarizing layer is perpendicular to the stretching direction. In some embodiments, the above polarizing material 19 is an iodine molecular material.

In some embodiments, the polarizing layer is produced on the base layer by:

coating the base layer with an impregnation solution including a polarizing material;

providing a barrier layer on such a region of the base layer coated with the impregnation solution that corresponds to at least one of the second region or the third region;

orienting the base layer provided with the barrier layer by applying a magnetic field or by stretching, such that polarizing molecules in the polarizing material are aligned in a specified manner;

immobilizing and drying the polarizing material; and removing the barrier layer to obtain the polarizing layer on the base layer.

In these embodiment, by providing the barrier layer on such a region of the base layer coated with the impregnation solution that corresponds to at least one of the second region or the third region, the polarizing material on said region of the base layer is squeezed out by the barrier layer, such that region covered by the barrier layer does not include the polarizing material or only includes a small amount of polarizing material, so as to produce the polarizing layer including at least one of the second region or the third region. In addition, a region of the base layer coated with the impregnation solution but uncovered by the barrier layer will be realized as the first region of the polarizing layer.

Figure 16:
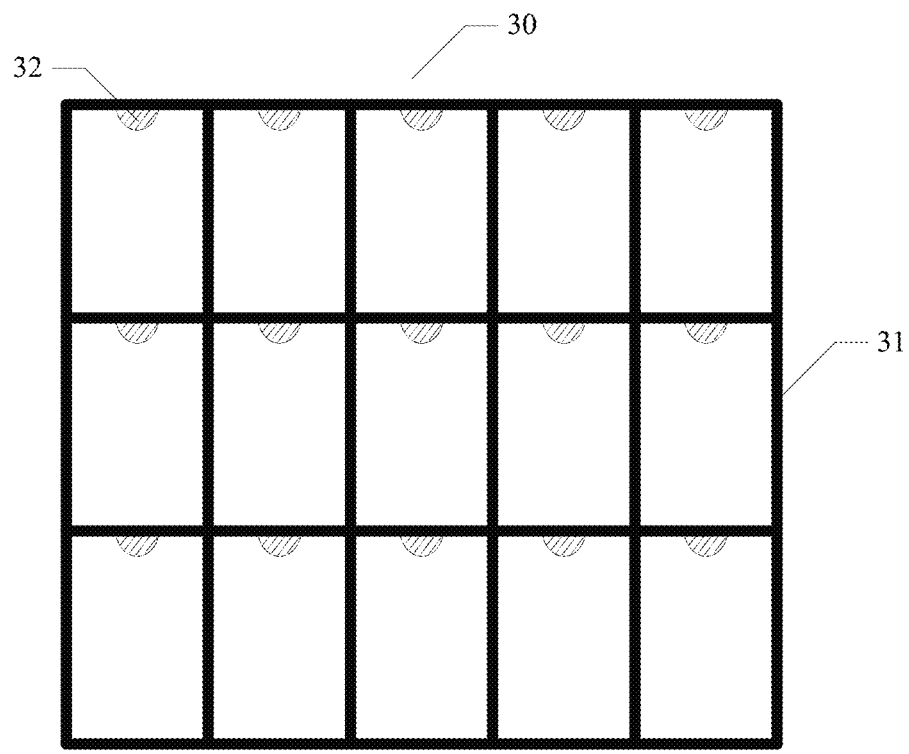
FIG. 16 is a schematic diagram of a barrier layer according to some embodiments of the present disclosure.

FIG. 16 is a schematic diagram of a barrier layer according to some embodiments of the present disclosure, as illustrated in FIG. 16, the barrier layer 30 includes a grid-shaped frame 31 and a projection part 32 located in each compartment of the frame 31 and connected with the frame 31. The frame 31 includes a plurality of compartments, each of which corresponds to one polarizing sheet. The shape and size of the compartment may be designed according to the shape and size of the polarizing sheet to be produced.

As illustrated in FIG. 16, a region corresponding to the projection part 32 in the compartment of the frame 31 will be realized as at least one of the second region or the third region of the polarizing layer, and a region outside the projection part 32 in the compartment will be realized as the first region of the polarizing layer. The barrier layer 30 may be made as a film, a plastic adhesive layer or any other forms easy to peel off.

In addition, the way of removing the barrier layer includes but is not limited to the followings: peeling off the barrier layer; rinsing away the barrier layer; or subjecting the barrier layer to exposure. For example, when the barrier layer is made as the forms easy to peel off, such as a film, a plastic adhesive layer, the barrier layer may be removed by peeling off the barrier layer. For another example, when the barrier layer is made of a material which is removable by exposure, the barrier layer may be removed by exposure or rinsing.

In addition, if the polarizing material is oriented by stretching the base layer, the shape of the base layer will change. In an implementation, the barrier layer may be provided before the base layer is stretched, subsequently, the barrier layer and the base layer may be stretched together, in this case, the deformation quantity of the barrier layer before and after stretched needs to be considered in advance, such that the shape and the size of the barrier layer after stretched meet the requirements of the polarizing sheet to be produced. In another implementation, the barrier layer may be provided after the base layer is stretched, so that it does not need to stretch the barrier layer.

In some other embodiments, the polarizing layer is produced on the base layer by:

providing a barrier layer on such a region of the base layer that corresponds to at least one of the second region or the third region;

coating the base layer having the barrier layer with an impregnation solution including a polarizing material;

orienting the base layer coated with the impregnation solution by applying a magnetic field or by stretching, such that polarizing molecules in the polarizing material are aligned in a specified manner;

immobilizing and drying the polarizing material; and removing the barrier layer to obtain the polarizing layer on the base layer.

As compared with the previous embodiments, the sequence of the first two steps is changed in this embodiment. It should be noted that, the barrier layer used in this embodiment may also be as shown in FIG. 16, and may be made as a film, a plastic adhesive layer or any other forms which are easy to peel off.

Figure 17:
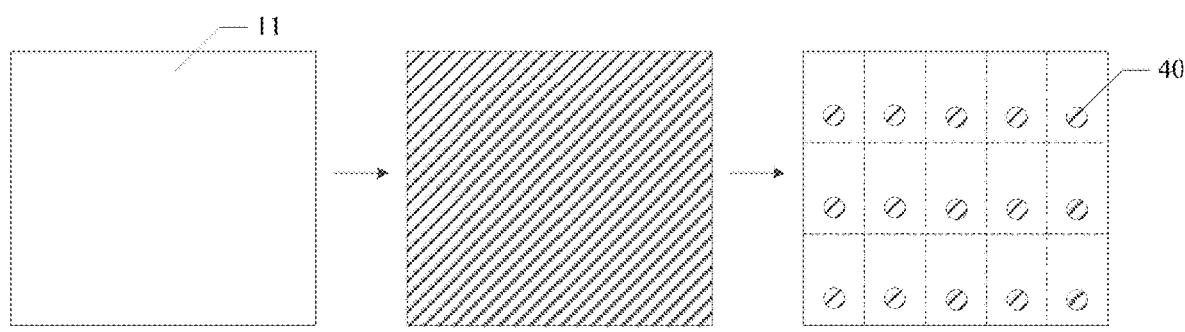
FIG. 17 is a schematic diagram illustrating a production process of a barrier layer according to some embodiments of the present disclosure.

In other embodiments, the barrier layer may also be made of a material which is removable by exposure. For example, as illustrated in FIG. 17, the barrier layer is provided on the base layer by: coating the base layer 11 with a barrier layer material that is removable by exposure (as indicated by oblique lines in FIG. 17); and removing the barrier layer material at a target region by exposure or by rinsing while retaining the barrier layer material at a remaining region 40 (as indicated by circles in FIG. 17) except the target region, so as to obtain the barrier layer. Accordingly, in the operation of removing the barrier layer, the barrier layer may be removed by exposure and/or by rinsing, so as to obtain the required polarizing layer on the base layer.

In yet some other embodiments, the polarizing layer is produced on the base layer by:

coating the base layer with an impregnation solution including a polarizing material;

orienting the base layer coated with the impregnation solution by applying a magnetic field or by stretching, such that polarizing molecules in the polarizing material are aligned in a specified manner;

immobilizing and drying the polarizing material to obtain a polarizing precursor layer; and treating a specified region of the polarizing precursor layer to make the specified region lose a polarizing function or to weaken the polarizing function of the specified region, the specified region includes at least one of the second region or the third region.

In some embodiments, treating a specified region of the polarizing precursor layer may be performed by one or more of the followings:

grinding off the polarizing material in the specified region by a CNC technology;

destroying the polarizing function of the polarizing material in the specified region by local heating;

destroying the polarizing function of the polarizing material in the specified region by local corrosion;

destroying the polarizing function of the polarizing material in the specified region by applying a magnetic field; and destroying the polarizing function of the polarizing material in the specified region by ultraviolet irradiation.

In addition, when the base layer is used to manufacture a plurality of the polarizing sheets, the plurality of the polarizing sheets may be separated at different steps. In some embodiments, after the polarizing material is immobilized and dried, the plurality of the polarizing sheets may be separated from each other first by cutting or tailoring, etc., and then a specified region of each polarizing sheet is processed to make the specified region lose a polarizing function or to weaken the polarizing function of the specified region. In some embodiments, it is also feasible that when the base layer with the polarizing precursor layer is still in a larger size, for example in a form as a roll, a specified region of the polarizing precursor layer may be processed first to make the specified region lose a polarizing function or to weaken the polarizing function of the specified region so as to obtain the polarizing layer, followed by separating the plurality of the polarizing sheets from each other by cutting or tailoring.

It should be noted that, even though in some embodiments regarding the method for manufacturing the polarizing sheet, the production process of the polarizing layer is mainly described, the polarizing sheet may further include a TAC film, a protective film, a PSA layer, a release film, etc., which may be added as required and will not be limited herein.

As such, with the method for manufacturing a polarizing sheet according to embodiments of the present disclosure, by forming the polarizing layer on the base layer, and producing at least one of the second region or the third region with better light transmission property in the polarizing layer through a manufacturing process, an optical component (such as a camera, a light sensor, etc.) may be set under at least one of the second region or the third region, and is able to work properly. As a result, the working performance of the optical component under the display screen may be ensured to the greatest extent.

In addition, embodiments of the present disclosure provide a variety of production processes for the polarizing layer, which may be flexibly selected according to production requirements.

It is to be understood that, a phase of "a plurality of" used herein means two or more than two, unless specified otherwise. It should also be understood that, the term "and/or" used herein describes relationships of one or more associated listed items, represents and contains any one and all possible combinations of one or more associated listed items, for example, the expression "A and/or B" indicates three cases where A exists separately, B exists separately, and A and B exist at the same time. In addition, the character "/" indicates that the associated items are in an "or" relationship.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," and "counterclockwise" should be construed to refer to the orientation as then described or as shown in the drawings under discussion. These relative terms are for convenience of description and do not require that the present disclosure be constructed or operated in a particular orientation.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

In the present disclosure, the term "connected," and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

Reference throughout this specification to "an embodiment," "some embodiments," "one embodiment," "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment," "in an embodiment," "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

The invention claimed is:

1. A polarizing sheet, comprising:
a base layer; and
a polarizing layer, attached to the base layer and comprising, in a same plane, a combination of a first region, a second region and a third region, wherein the first region, the second region and the third region have identical thicknesses,
wherein the first region has a transmittance lower than a transmittance of the second region; and the third region is located between the first region and the second region and has a transmittance between the transmittance of the first region and the transmittance of the second region;
wherein the transmittance of the second region is greater than 50%;
wherein the first region has a polarizing function, the second region has no polarizing function, and the third region has a polarizing function between the polarizing function of the first region and the polarizing function of the second region; and
wherein the polarizing function of the first region and the polarizing function of the third region are obtained with a same polarizing material.

2. The polarizing sheet according to claim 1, wherein the first region comprises a polarizing material having the polarizing function; and
the second region does not comprise the polarizing material.

3. The polarizing sheet according to claim 1, wherein the first region comprises a first polarizing material having the polarizing function; and
the second region comprises a second polarizing material having no polarizing function.

4. The polarizing sheet according to claim 3, wherein the second region having no polarizing function is obtained by deactivating the polarizing function of the second region by means of at least one of:
grinding the second polarizing material by a computer numerical control CNC technology;
heating the second polarizing material;
etching the second polarizing material;
misaligning polarizing molecules in the second polarizing material; or
irradiating the second polarizing material by ultraviolet.

5. The polarizing sheet according to claim 1, further comprising: a release film, a pressure sensitive adhesive PSA layer, a lower tri-acetyl cellulose TAC film, an upper TAC film, and a protective film from bottom to top;
wherein the base layer is located between the lower TAC film and the upper TAC film; and
the polarizing layer is located between the base layer and the upper TAC film or located between the base layer and the lower TAC film; or
the polarizing layer is located between the base layer and the upper TAC film and located between the base layer and the lower TAC film.

6. The polarizing sheet according to claim 1, wherein the polarizing function of the third region is obtained by
grinding off the polarizing material in the third region by a computerized numerical control (CNC) technology; or
removing the polarizing function of the polarizing material in the third region by at least one of: local heating; local etching; or applying a magnetic field.

7. A terminal, comprising:
a display screen, comprising:
a display panel; and
a polarizing sheet, comprising:
a base layer; and
a polarizing layer, attached to the base layer, and comprising, in a same plane, a combination of a first region, a second region having a light transmission property superior to that of the first region, and a third region located between the first region and the second region and having a light transmission property superior to that of the first region but inferior to that of the second region, wherein the first region, the second region and the third region have identical thicknesses; and
an optical component disposed under the second region;
wherein a transmittance of the second region is greater than 50%;
wherein the first region has a polarizing function, the second region has no polarizing function, and the third region has a polarizing function between the polarizing function of the first region and the polarizing function of the second region; and
wherein the polarizing function of the first region and the polarizing function of the third region are obtained with a same polarizing material.

8. The terminal according to claim 7, wherein the display panel comprises:
a substrate; and
a display layer, disposed above the substrate and comprising:
a first display region corresponding to the first region; and
a second display region corresponding to the second region and having a light transmission property superior to that of the first display region,
wherein the optical component is disposed under the second display region;
wherein sizes of sub-pixels in the second display region are set to be larger that of sub-pixels in the first display region.

9. The terminal according to claim 8, wherein the display layer further comprises a third display region corresponding to the third region and located between the first display region and the second display region;
wherein sizes of sub-pixels in the third display region are larger than that of the sub-pixels in the first display region but smaller than that of the sub-pixels in the second display region.

10. The terminal according to claim 7, wherein
the display panel is an organic light-emitting diode (OLED) display panel, and the polarizing sheet is located above the OLED display panel; or
the display panel is a liquid crystal display (LCD) panel, and the display screen comprises an upper polarizing sheet located above the LCD panel and a lower polarizing sheet located under the LCD panel.

11. The terminal according to claim 7, wherein the polarizing function of the third region is obtained by
grinding off the polarizing material in the third region by a computerized numerical control (CNC) technology; or
removing the polarizing function of the polarizing material in the third region by at least one of: local heating; local etching; or applying a magnetic field.

12. A method for manufacturing a polarizing sheet, the method comprising:
providing a base layer; and
producing a polarizing layer on the base layer,
wherein
the polarizing layer comprises, in a same plane, a combination of a first region, a second region and a third region;
the first region, the second region and the third region have identical thicknesses;
the first region has a transmittance lower than a transmittance of the second region; and the third region has a transmittance between the transmittance of the first region and the transmittance of the second region;
the transmittance of the second region is greater than 50%;
the first region has a polarizing function, the second region has no polarizing function, and the third region has a polarizing function between the polarizing function of the first region and the polarizing function of the second region; and
the polarizing function of the first region and the polarizing function of the third region are obtained with a same polarizing material.

13. The method according to claim 12, wherein the producing a polarizing layer on the base layer comprises:
coating the base layer with an impregnation solution comprising a polarizing material;
providing a barrier layer on such a region of the base layer coated with the impregnation solution that corresponds to at least one of the second region or the third region;
orienting the base layer provided with the barrier layer by applying a magnetic field or by stretching, such that polarizing molecules in the polarizing material are aligned in a specified manner;
immobilizing and drying the polarizing material; and
removing the barrier layer to obtain the polarizing layer on the base layer.

14. The method according to claim 12, wherein the producing a polarizing layer on the base layer comprises:
providing a barrier layer on such a region of the base layer that corresponds to at least one of the second region or the third region;
coating the base layer having the barrier layer with an impregnation solution comprising a polarizing material;
orienting the base layer coated with the impregnation solution by applying a magnetic field or by stretching, such that polarizing molecules in the polarizing material are aligned in a specified manner;
immobilizing and drying the polarizing material; and
removing the barrier layer to obtain the polarizing layer on the base layer.

15. The method according to claim 14, wherein the providing a barrier layer on the base layer comprises:
coating the base layer with a barrier layer material that is removable by exposure; and
removing the barrier layer material at a target region by exposure or by rinsing to obtain the barrier layer at a remaining region.

16. The method according to claim 13, wherein the barrier layer is removed by at least one of the followings:
peeling off the barrier layer;
rinsing away the barrier layer; and
subjecting the barrier layer to exposure.

17. The method according to claim 12, wherein the producing a polarizing layer on the base layer comprises:
coating the base layer with an impregnation solution comprising a polarizing material;
orienting the base layer coated with the impregnation solution by applying a magnetic field or by stretching, such that polarizing molecules in the polarizing material are aligned in a specified manner;
immobilizing and drying the polarizing material to obtain a polarizing precursor layer; and
treating a specified region of the polarizing precursor layer to make the specified region lose a polarizing function or to weaken the polarizing function of the specified region,
wherein the specified region comprises at least one of the second region or the third region.

18. The method according to claim 17, wherein the treating a specified region of the polarizing precursor layer comprises one or more of:
grinding off the polarizing material in the specified region by a computerized numerical control (CNC) technology; or
removing the polarizing function of the polarizing material in the specified region by at least one of:
local heating; local etching; or applying a magnetic field.

* * * * *